United States Patent
Nakayama

(10) Patent No.: US 7,834,997 B2
(45) Date of Patent: Nov. 16, 2010

(54) STANDARD COMPONENT FOR CALIBRATION AND CALIBRATION METHOD USING IT AND ELECTRO BEAM SYSTEM

(75) Inventor: Yoshinori Nakayama, Sayama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 332 days.

(21) Appl. No.: 11/744,906

(22) Filed: May 7, 2007

(65) Prior Publication Data

US 2008/0067447 A1 Mar. 20, 2008

(30) Foreign Application Priority Data

May 10, 2006 (JP) .............................. 2006-130966

(51) Int. Cl.
*G01J 1/10* (2006.01)
(52) U.S. Cl. .................. 356/243.1; 356/401; 250/311; 250/252.1
(58) Field of Classification Search ... 356/243.1–243.8, 356/399–401, 121; 250/548, 252.1, 311, 250/491.1, 492.2, 306, 307, 310; 430/22, 430/30
See application file for complete search history.

(56) References Cited

U.S. PATENT DOCUMENTS 5,808,742 A * 9/1998 Everett et al. ............... 356/509
7,078,691 B2 * 7/2006 Nakayama .................. 250/311
7,365,306 B2 * 4/2008 Nakayama ................ 250/252.1
2002/0158193 A1 * 10/2002 Sezginer et al. .......... 250/237 G
2005/0184234 A1 * 8/2005 Nakayama .................. 250/311
2006/0289756 A1 * 12/2006 Nakayama .................. 250/310
2007/0114449 A1 * 5/2007 Nakayama ................ 250/491.1
2007/0176128 A1 * 8/2007 Van Bilsen et al. .......... 250/548
2007/0229829 A1 * 10/2007 Kandel et al. ............... 356/401
2008/0198467 A1 * 8/2008 Nakayama .................. 359/569

FOREIGN PATENT DOCUMENTS

| JP | 2004-251682 | 9/2004 |
| JP | 2004-340838 | 12/2004 |
| JP | 2005-241328 | 9/2005 |

* cited by examiner

*Primary Examiner*—Hoa Q Pham
(74) *Attorney, Agent, or Firm*—Antonelli, Terry, Stout & Kraus, LLP.

(57) ABSTRACT

The positions of diffraction gratings used for calibration can be checked easily by arranging marks near the diffraction gratings, the marks indicating the coordinate positions of the diffraction gratings. Dummy patterns including a pattern of cross marks are arranged around the array of the diffraction gratings. Consequently, a uniform diffraction grating pattern is accomplished in which the proximity effect is uniform across the diffraction grating array. Furthermore, cross marks can be disposed adjacent to the diffraction grating array. Therefore, the diffraction gratings can be placed in position and calibrated accurately and easily by using a standard component capable of realizing accurate positioning of the diffraction gratings. Hence, accurate metrology calibration coping with the next generation of semiconductor lithography technology can be accomplished.

23 Claims, 11 Drawing Sheets

FIG. 1B
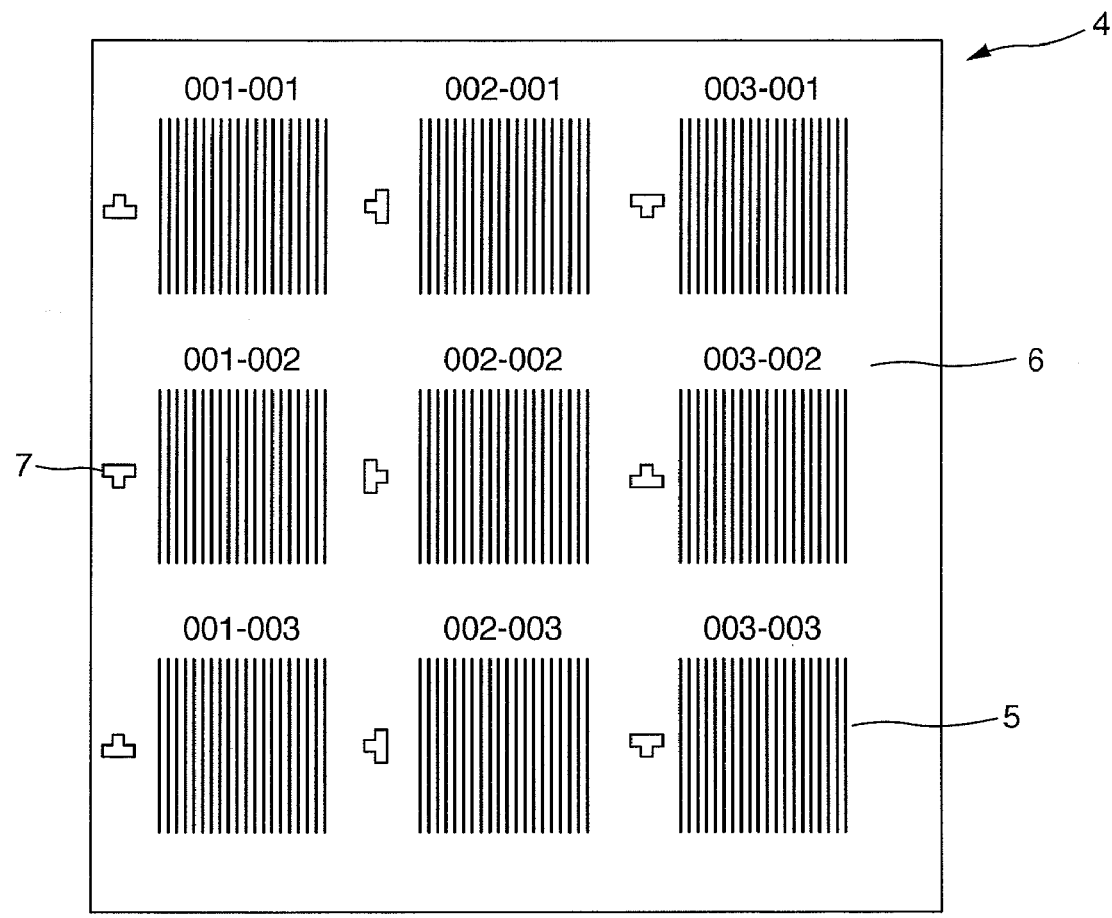
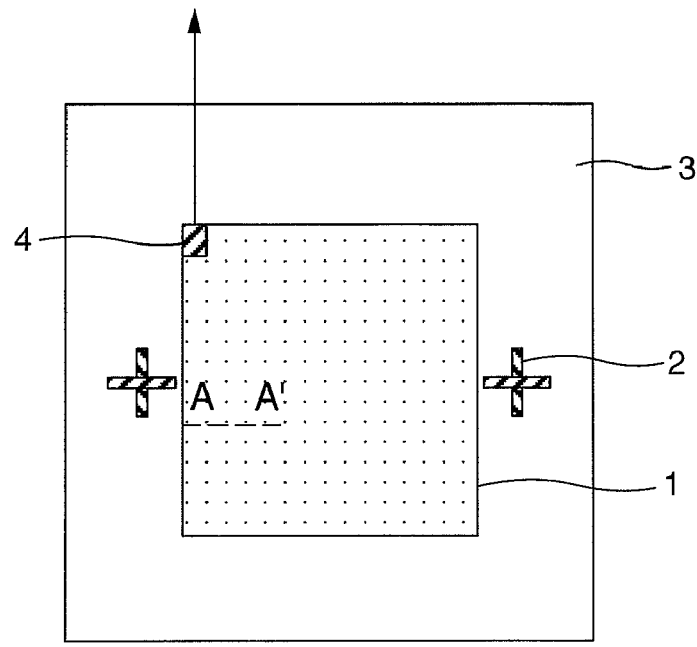
FIG. 1A

FIG. 6B
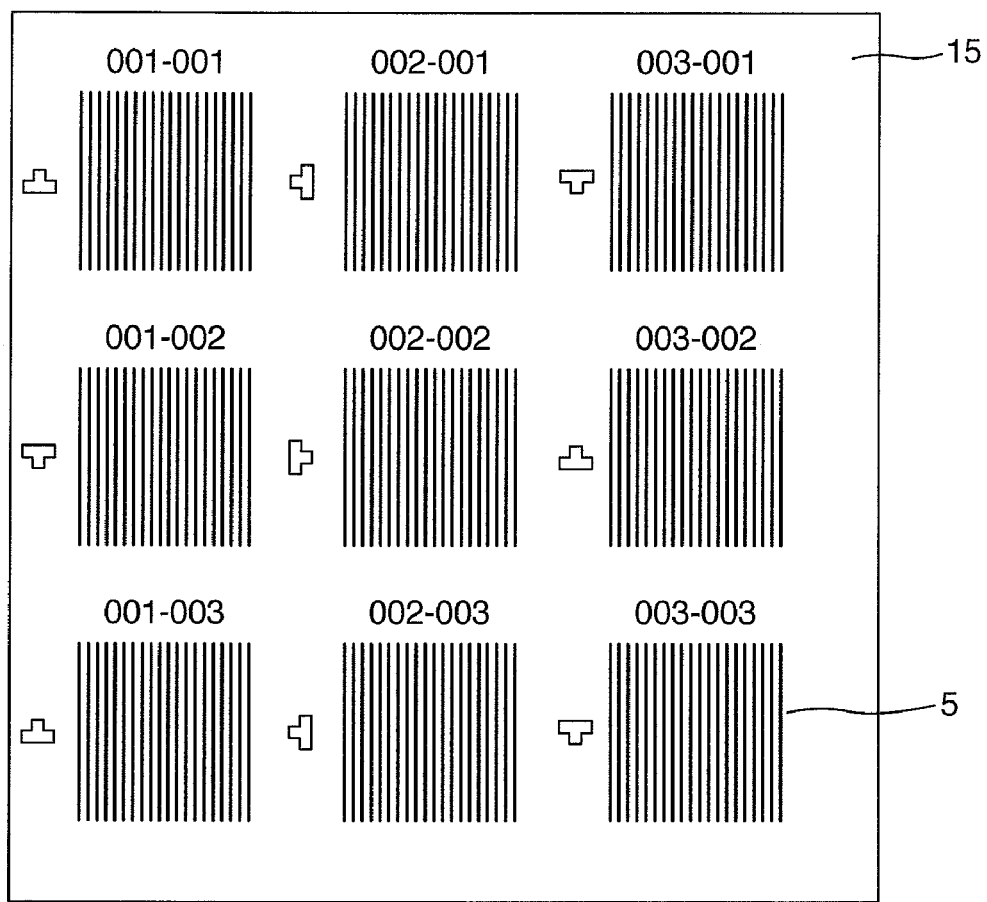
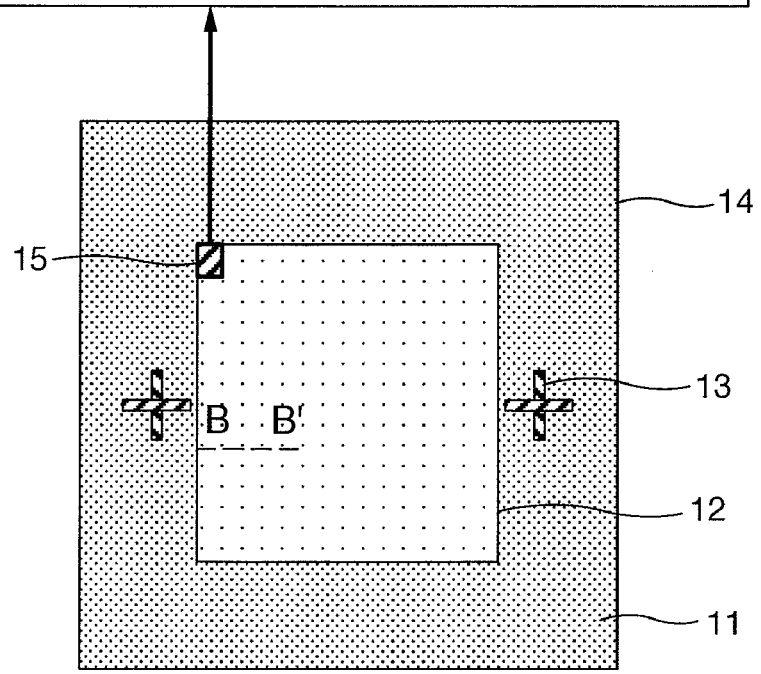
FIG. 6A ized pattern and whose size is almost the same as that of the cross marks. However, in the case of the standard component, the pitch is as extremely fine as about 240 nm, for example, compared with the size of each cross mark. Furthermore, the pattern units are arrayed with a pitch of several micrometers. Therefore, where a microscope image is accepted, pattern units are clearly distinguished. However, the cross marks are not distinguished from each other.

STANDARD COMPONENT FOR CALIBRATION AND CALIBRATION METHOD USING IT AND ELECTRO BEAM SYSTEM

INCORPORATION BY REFERENCE

The present application claims priority from Japanese application JP 2006-130966 filed on May 10, 2006, the content of which is hereby incorporated by reference into this application.

BACKGROUND OF THE INVENTION

The present invention relates to a standard component and to a calibration method using it. Especially, the invention relates to a standard component for an electron beam and to a calibration method for it.

Heretofore, when a microscope or other similar instrument such as an electron microscope or AFM (atomic force microscope) is adjusted, a standard sample for calibration has been used. The standard sample for calibration is a member on which a pattern or marks having a previously known size or length are formed. When the instrument is adjusted, an image of the pattern or marks is acquired at a certain magnification. The instrument is adjusted such that the pattern or marks are displayed in a given size on the acquired image.

Heretofore, a member made of a semiconductor substrate several millimeters to several centimeters square on which a one-dimensional diffraction grating pattern is formed has been used as a standard component for an electron microscope. The whole of a surface on which the pattern of the standard component is formed is shown in FIG. 12A. FIG. 12B is an enlarged view of a part of the surface shown in FIG. 12A. Grooves in the one-dimensional diffraction grating pattern formed on the front surface of the substrate are indicated by numeral 121. Since the accuracy of calibration is determined depending on the pitch dimension of the patterned grooves in the one-dimensional diffraction gratings, it is necessary to form the patterned grooves accurately. However, it is difficult to form grooves with fine pitch dimensions with high accuracy. Under the present situation, the accuracy of the pitch dimensions of patterned grooves that can be formed is approximately 1 nm.

JP-A-2004-251682 discloses a standard component having a semiconductor substrate on which plural diffraction grating units are formed. The diffraction grating units have one-dimensional diffraction gratings in which subgratings are formed. Cross marks for alignment are formed around the diffraction grating units. In the invention described in the above-cited JP-A-2004-251682, diffraction grating units used for calibration are selected, using the cross marks formed around the array of one-dimensional diffraction grating pattern units and the cross marks arranged between the one-dimensional diffraction grating pattern units. In particular, the standard component placed on a sample stage is moved into a primary electron beam irradiation position by stage movement. The cross marks formed around the diffraction grating units are detected. Since the coordinates of the mark positions on the stage and the coordinates of the diffraction grating units on the stage to which the component should be moved are already known, the amount of movement of the stage from any mark position and the movement target can be calculated. Consequently, the stage is made to move the calculated amount of movement. The one-dimensional diffraction grating unit forming a target position is moved into the primary electron beam irradiation position. The microscope is configured using a microscope image of the diffraction grating unit in a given position, the image being derived as described above.

Where a microscope or other similar instrument is calibrated using a standard component made up of plural diffraction grating units such as the standard component disclosed in the above-cited JP-A-2004-251682, it is necessary to move the diffraction grating unit used for calibration into the field of view of the microscope image. In this case, the following problems take place.

First, there is the problem that it is impossible to check whether or not the diffraction grating unit moved into the field of view of the microscope image by stage movement is a correct diffraction grating unit. In the standard component disclosed in the above-cited JP-A-2004-251682, diffraction grating units with the exactly identical pattern are formed up and down and right and left. It is substantially impossible for an unskilled operator to visually discriminate between individual diffraction grating units on the image. It is difficult even for a skilled operator to perform this operation.

Furthermore, in a normal microscope or other similar instrument, movement of a desired diffraction grating unit into the field of view of a microscope image is controlled using only information about the coordinates of the stage. Accordingly, if the coordinates of the position used in controlling the stage are in error, it is impossible to move the intended diffraction grating unit into the field of view of the microscope image. In addition, because of the limitations of mechanical control, the accuracy of the stage position control is on the micrometer order at best. Consequently, in order that the intended diffraction grating unit be placed within the field of view, it is necessary to provide control for modifying the electron beam irradiation position, in addition to stage movement. Accordingly, where calibration is performed using a standard component made up of plural diffraction grating units, diffraction grating units are selected by making use of only stage movement consciously of involvement of uncertainty. Alternatively, a skilled operator moves a desired diffraction grating unit into the field of view while relying on his intuition.

Secondly, because information used in controlling the movement of the stage is only information about the coordinates of cross marks and the target position, if any one of the cross marks cannot be detected because of contamination or defectiveness, it is impossible or difficult to move the stage itself.

SUMMARY OF THE INVENTION

Accordingly, it is an object of the present invention to provide a standard component for accurate calibration of a microscope, the component having plural pattern units used for calibration as well as one-dimensional diffraction gratings, the component facilitating selecting and checking one of the pattern units which is used for calibration. It is another object of the invention to provide a calibration method using such a standard component.

These objects are achieved in accordance with the teachings of the invention by (i) preparing a standard component which is used for calibration of a microscope and which has plural pattern units and (ii) forming marks or indicia near the pattern units. The marks or indicia are used to identify the coordinates of array positions of diffraction grating units. For example, it is conceivable that the marks or indicia are numerals or numbers corresponding to the coordinates of the positions of the pattern units.

With respect to the standard component for an electron microscope, the marks or indicia formed on the component need to provide sufficient contrast in an image of secondary charged particles (such as secondary electrons or backscattered electrons) induced by electron beam irradiation. Where the pattern units formed on the standard component are one- or two-dimensional diffraction gratings, the size of the marks or indicia relative to the pitch dimension of the diffraction gratings is varied to such an extent that optical measurement of the absolute dimension of the pitch is not affected. More preferably, the size is increased for the following reason. The accuracy of measurement of the absolute dimension of the pitch dimension of the diffraction gratings using an optical measurement technique should not be affected.

With respect to the standard component for an electron microscope, the absolute dimension of the lattice pitch needs to be stipulated by optical measurement such as laser metrology in order to secure sufficient high calibration accuracy. Where the size of the marks or indicia is substantially identical with the pitch dimension of the diffraction gratings, periodic pattern arrays corresponding to an integral multiple of the pitch dimension of the diffraction gratings are formed by the plural marks or indicia formed near the pattern units. The measurement of the absolute dimension using the optical measurement is adversely affected. That is, in optical measurement, the diffraction gratings are illuminated with laser light. The pitch dimension is found from the optical diffraction angle. The marks or indicia formed near the diffraction gratings are also illuminated with the laser light. Therefore, if the marks or indicia have a pitch substantially identical with the pitch of the diffraction gratings, diffraction light is produced from the marks or indicia near the diffraction light originating from the diffraction gratings. This gives rise to error in measuring the optical diffraction angle in measurement of the pitch dimension. Accordingly, it is necessary to make the size of the formed indicia different from the pitch dimension of the diffraction gratings or an integral multiple of the pitch dimension.

Because of the structure described so far, a standard component for accurate calibration is accomplished, the component facilitating selecting and checking a pattern unit used for calibration.

According to the present invention, the array coordinate positions of diffraction grating units within a diffraction grating array can be easily identified and so positioning can be reliably performed without regardless of the accuracy of the stage of the electron-beam metrology system to be calibrated or of the accuracy of beam deflection. This enables calibration using desired diffraction grating units by managing the number of uses. Furthermore, the calibration is enabled without depending on the positioning accuracy of the electron-beam metrology system to be calibrated. Moreover, with respect to the above-described positioning, in the prior-art standard component, movement of the relative coordinate using cross marks arranged around the array of diffraction gratings has been indispensable. In the present invention, numerals or symbols indicating the coordinates of an array position are arranged for each diffraction grating unit and, therefore, the calibration procedure can also be simplified because the procedure only consists of moving the diffraction grating units directly, observing numerals or symbols indicating the coordinates of an array position, and setting a relative amount of movement from the position.

Besides, in the pattern arrangement of the present invention, a rectangular pattern is arranged around the diffraction grating array. This makes uniform the proximity effect within the diffraction grating array. Consequently, a uniform dimensional distribution can be accomplished within the diffraction grating array. The numerals or symbols and rectangular pattern added by the present invention do not affect the accuracy at which the optical diffraction angle is measured when the absolute pitch dimension of the standard component is found. Measurements can be performed at accuracy comparable with the accuracy achieved heretofore. In the present embodiment, a rectangular pattern is used as a pattern located around the diffraction grating array. Similar advantages can be obtained with a nonrectangular pattern having a total area of pattern approximately equal to the total area of the rectangular pattern. If repeating elements at intervals close to the pitch dimension of the diffraction gratings are included, the accuracy at which the diffraction angle is measured is deteriorated. If a complex pattern is used, the electron beam exposure time is prolonged. Consequently, a simple rectangular pattern produces effective results.

Other objects, features and advantages of the invention will become apparent from the following description of the embodiments of the invention taken in conjunction with the accompanying drawings.

BRIEF DESCRIPTION OF THE DRAWINGS

FIG. 1A is a top view of the whole of a standard component for calibration, the standard component being built according to Embodiment 1 of the present invention.

FIG. 1B is a fragmentary enlarged view of the standard component shown in FIG. 1A.

FIG. 6A is a top view of the whole of a standard component for calibration, the standard component having patterns for correction of the proximity effect.

FIG. 6B is a fragmentary enlarged view of the standard component shown in FIG. 6A and used for calibration, the standard component having the patterns for correction of the proximity effect.

DETAILED DESCRIPTION OF THE INVENTION

Embodiment 1

Figure 2:
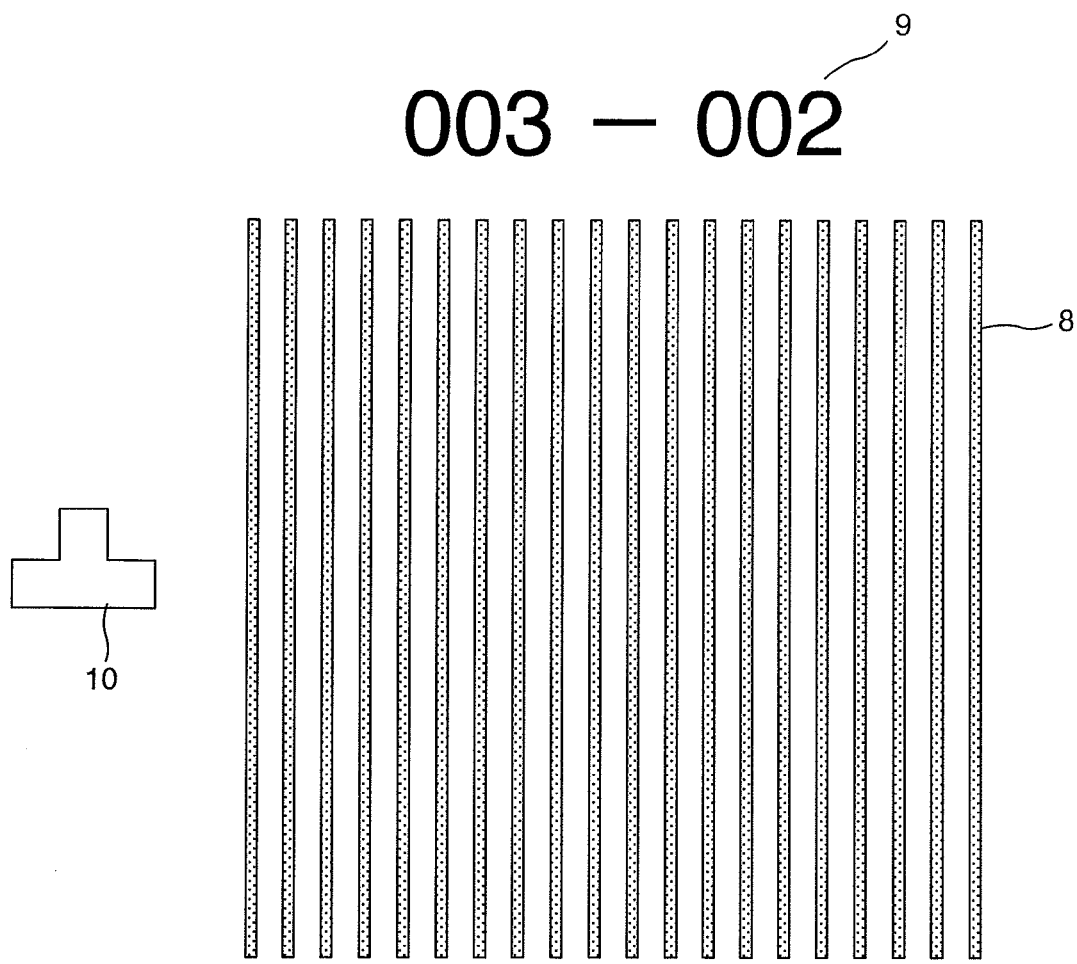
FIG. 2 is an enlarged view of diffraction grating units of the standard component for calibration, the standard component being shown in FIGS. 1A and 1B.

In the present embodiment, an example of structure of a dimension standard component for an electron-beam metrology system or critical dimension scanning electron metrology (CD-SEM) system and an example of usage of the standard component when it is actually used in the electron-beam metrology system are described.

The top surface of the standard component of the present embodiment is totally shown in FIG. 1A. A pattern is formed on this top surface. The standard component shown in FIG. 1A has a rectangular silicon substrate 3 on which a region 1 and cross marks 2 for correction of rotation error are formed. The pattern for calibration is formed in the region 1. The cross marks 2 are formed in regions spaced about 5.0 mm from ends of the calibration pattern formation region 1.

FIG. 1B is an enlarged view of a portion 4 of the calibration pattern formation region 1. One-dimensional diffraction grating units 5 are units of the pattern for calibration. Marks 6 indicating information about positions within the calibration pattern formation region 1 are formed beside the diffraction grating units.

In the pattern formation region 1, 500 identical one-dimensional diffraction grating units 5 are arranged in a repetitive manner vertically and horizontally at pitch intervals of 5 μm. Convex marks 7 for alignment are arranged around the 1D diffraction grating units 5. Marks 6 indicating the coordinates of the diffraction grating units in the array in the vertical and horizontal directions are arranged above the upper sides of the 1D diffraction grating units 5 and spaced 0.5 μm from them.

In the present embodiment, each mark 6 is made of a combination of three digits which indicate the orders of the 1D diffraction grating units in the vertical and horizontal directions under the condition where the pattern unit located at the left upper end of the calibration pattern formation region 1 is at the origin. For example, in FIG. 1B, the mark corresponding to the 1D grating unit arranged at the left upper end is "001-001". The marks in the first row form an array of 002-001, 003-001 . . . 00n-001 . . . 500-001 in the X-direction. Similarly, the marks in the first column form an array of 001-002, 001-003 . . . 001-00n . . . 001-500 in the Y-direction. The 1D diffraction grating units 5 are so arranged that the array period within the calibration pattern formation region 1 is an integral multiple of the pitch dimension of the grooves in the pattern of the 1D diffraction gratings. A criterion by which the array period (in other words, the pitch dimension between the 1D diffraction grating units) can be determined at will. One example of the criterion is the center-to-center distance between adjacent ones of the 1D diffraction grating units. Another example is the end-to-end distance between adjacent ones of the 1D diffraction grating units.

FIG. 2 is an enlarged view of one of the 1D diffraction grating units 5 shown in FIG. 1B. Shown in the enlarged view of FIG. 2 is the diffraction grating unit in the third row and the second column under the condition where the diffraction grating unit at the left upper end is at the origin. In the 1D diffraction grating unit 5 shown in FIG. 2, twenty grooves 8 in a pattern have a length of 3 μm and form a diffraction grating. The grooves 8 are arranged at pitches of 100 nm. As described previously, the mark "003-002" is formed on the upper side of the 1D diffraction grating unit 5. The size of each numeral forming the mark is 0.5 μm in width and 1 μm in height. The size of each numeral is greater than the pitch dimension of the grooves in the pattern.

In the standard sample of the present embodiment, measurement of the diffraction angle using laser light illumination shows that with respect to the patterned grooves within the pattern units, the absolute value of the pitch dimension is obtained at an accuracy of less than 1 nm. The convex pattern 10 is formed at a position shifted 2.5 μm leftwardly from the center of the 1D diffraction grating unit 5. In the present embodiment, the convex pattern is formed on the left side of the 1D diffraction grating unit. The pattern may be arranged on any side (e.g., upper side, lower side, left side, and right side) because if the positional relationship between the convex patterns is previously known, the beam is simply moved based on the design value of the relationship.

Figure 3A:
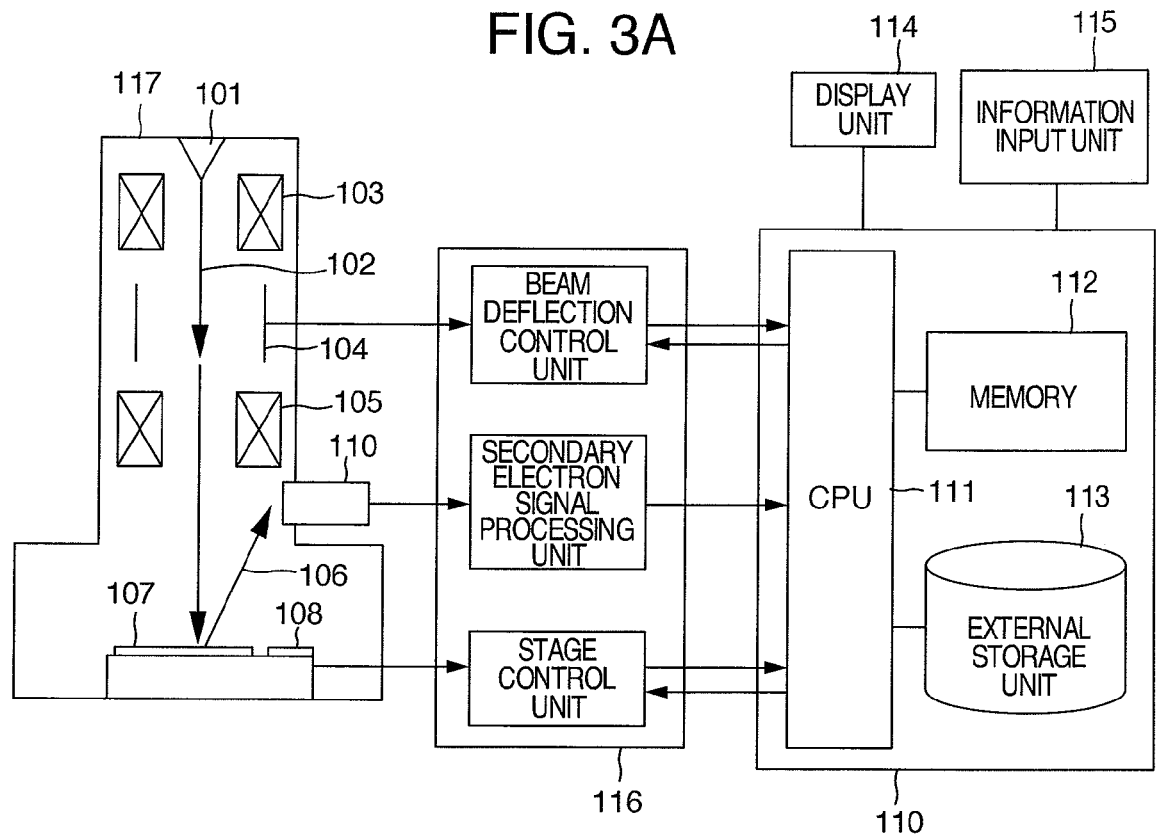
FIG. 3A is a block diagram of an electron-beam metrology system according to Embodiment 1 of the invention.
Figure 3B:
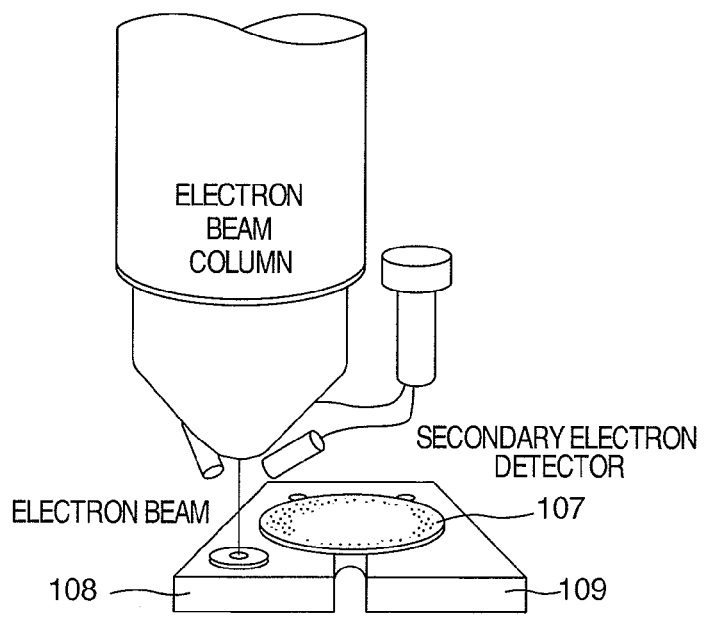
FIG. 3B is a perspective view of a part of the metrology system shown in FIG. 3A.

A method of calibrating a critical dimension scanning electron metrology (CD-SEM) system using the standard component of the present embodiment is next described. The whole configuration of the CD-SEM system using the standard component of the present embodiment is shown in FIG. 3A. FIG. 3B is a schematic perceptive view showing the positional relationship among the position of the calibration component placed on a sample stage, the position of the measured sample placed on the stage, and the position hit by an electron beam.

The critical dimension scanning electron metrology (CD-SEM) system shown in FIG. 3A includes a secondary electron microscope 117, an SEM control unit 116, and an information process unit 110. The secondary electron microscope 117 includes an electron gun 101 emitting an electron beam 102, a scan deflector 104 for scanning the beam 102 over a sample, lenses 103 and 105 for adjusting the focus of the beam on the sample whose length is to be measured, and a secondary electron detector 140 for detecting secondary electrons 106 or backscattered electrons produced in response to primary electron beam irradiation. The SEM control unit 116 includes a beam deflection control unit for controlling the scanning and deflection of the primary electron beam, a secondary electron signal process unit for processing the output signal from the secondary electron detector, and a stage control unit for controlling motion of a stage 109 on which the sample 107 whose length is to be measured or a standard component 108 is placed. The information process unit 110 includes a CPU 111 for processing various kinds of information or control signals entered from the SEM control unit, a memory 112 in which software operating on the CPU is expanded, and an external storage unit 113 in which information (such as about metrology recipe) and various kinds of software are stored. Furthermore, a display unit 114 on which the results of information processing performed by the CPU 111 are displayed, an information input unit 115 for entering information necessary for the information processing into the information process unit 110, and other devices are connected. The information input unit is realized by a keyboard, a computer mouse, or a GUI screen displayed on the display unit 114. The metrology SEM further includes other essential components not shown in FIG. 3A. As shown in FIG. 3B, the standard component 108 and the sample 107 whose length is to be measured are placed on the same stage.

The operation of the CD-SEM system shown in FIG. 3A is next described with reference to FIGS. 4 and 5. First, the standard component 108 is held to fixing jigs mounted at the corners of the stage 109. A wafer 107 that is a sample whose length is to be measured is placed on the stage 109. The stage 109 on which the standard component 108 and the wafer 107 are placed is transported into the vacuum housing of the secondary electron microscope 117 via a load lock chamber (not shown in FIG. 3A).

Then, information for correction of error in rotation of the standard component is calculated. Although the standard component 108 is held to the fixing jigs, the component is tilted relative to the X- and Y-axes along which the stage is driven when viewed on the scale of the resolution of the SEM. Therefore, in order to calibrate the metrology data using the standard component, information indicating the degree of tilt of the standard component relative to the direction along which the stage is moved is necessary. First, the stage is driven to move the standard component into the position hit by the electron beam. Then, an SEM image is obtained at a magnification at which at least the whole of any one of the left and right cross marks 2 shown in FIG. 1A enters the field of view. The positional coordinates of the left and right cross marks in the coordinate system used in driving and controlling the stage 109 are calculated by image-analyzing pixel data about the obtained image by the CPU 111. This work is performed for each of the left and right cross marks. The angle of the standard component relative to direction of movement of the stage is calculated from the difference between a vector connecting the left and right cross marks and the drive shaft of the stage (in the case of FIG. 1A, the drive shaft is in the X-direction). The calculated angle is stored as information for correction of rotation error in the memory 112 or in the external storage unit 113.

Figure 4:
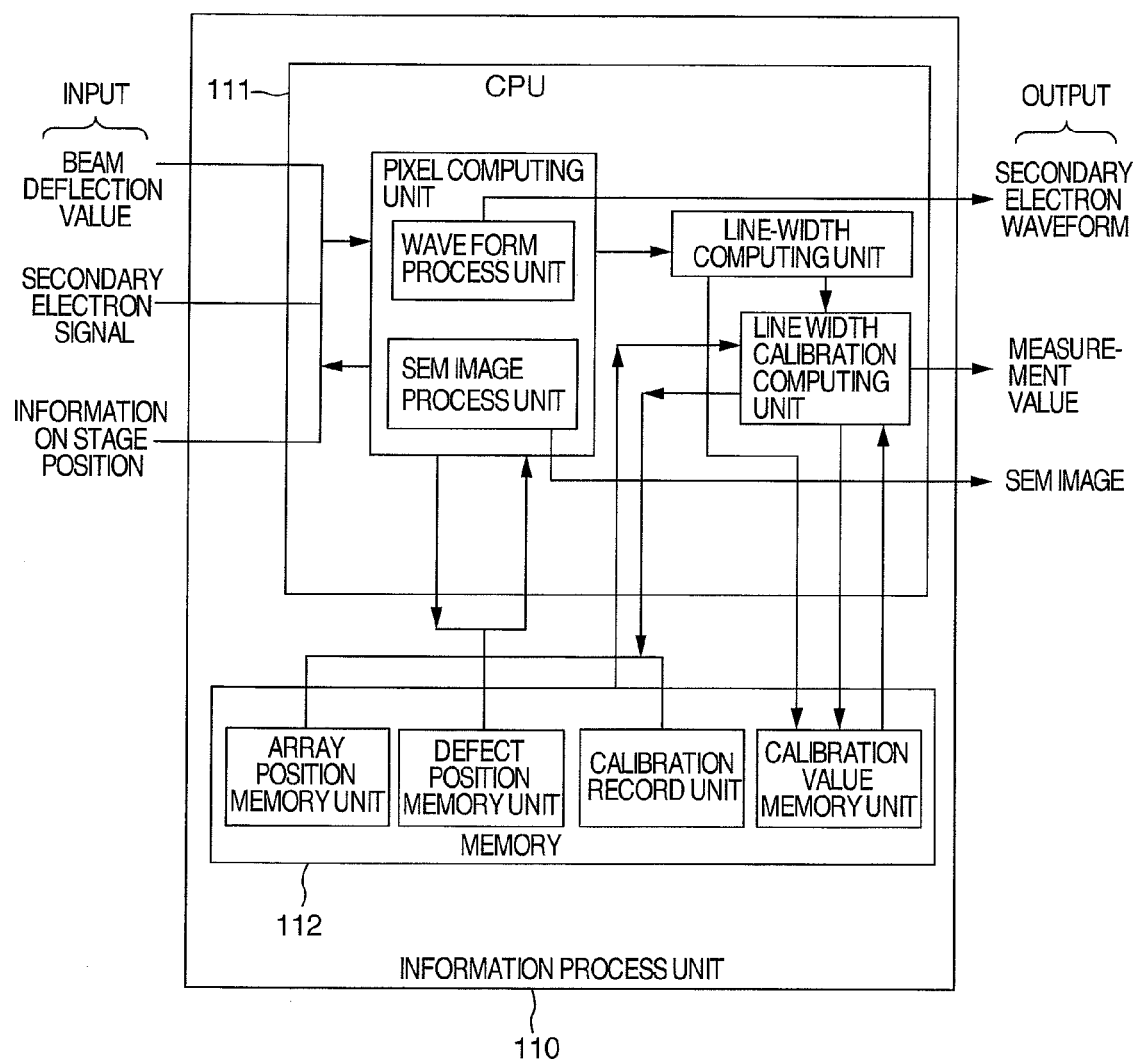
FIG. 4 is a functional block diagram of the inside of an information process unit included in the electron-beam metrology system shown in FIG. 3A.

FIG. 4 is a functional block diagram illustrating the functions realized in software by the information process unit 110. In practice, the functional blocks shown in FIG. 4 are accomplished by executing software for image analysis, the software being expanded in the memory 112 by the CPU 111 shown in FIG. 3A. As an example, the outputs from the beam deflection control unit, secondary electron signal process unit, and stage control unit shown in FIG. 3A are used as inputs to the information process unit 110 and discussed now. A pixel computing unit calculates information about the coordinates of the cross marks on the stage from the secondary electron signals indicating the left and right cross marks and from positional information used in controlling the stage. Furthermore, vector information used for calculation of a value for correcting the rotation error is calculated. The calculated vector information is routed to a line-width computing unit together with axial information used in driving the stage. The tilt angle of the standard component relative to the direction of motion of the stage is calculated. Information about the calculated tilt angle is routed to a correction coefficient memory unit, where the information is stored. Calculation of the information for correction of the rotation error described so far is automatically carried out by the information process unit 110, based on a response of the user of the instrument to an inquiry made as to whether the corrective information needs to be obtained, the corrective information being displayed on the display unit 114. Alternatively, the user of the instrument can execute the calculation by manual operations.

The above-described processing for obtaining the information for correcting the rotation error may also be executed using the convex marks 7 shown in FIG. 1B as well as the cross marks. In this case, vectors formed between the adjacent convex marks 7 for the 1D diffraction grating units 5 or virtual vertical lines drawn from the convex marks 7 to arbitrary grooves in the pattern within the 1D diffraction grating units 5 are used as vector information for calculation of the value for correcting the rotation error.

In principle, if any one of the set of the convex marks 7 or the set of the cross marks 2 is available, rotation error can be corrected. However, where the cross marks 2 are used, the correction accuracy can be enhanced by an amount corresponding to the capability of calculating the vector information over a longer distance. In addition, the positions where the cross marks 2 are formed can be arranged above, below, on the left side, or on the right side of the region 1 in which the pattern for calibration is formed. The cross marks need to be arranged in symmetrical positions in the vertical or horizontal direction. In other words, the marks need to be arranged in positions with two-fold symmetry about the center of the calibration pattern formation region 1. Similarly, the convex marks 7 need to be arranged in positions which are regularly spaced in given directions from given reference positions within the diffraction grating units. The reference positions may be arbitrary positions. Most simply, the centers of the diffraction grating units or the patterned grooves located at the extreme ends are selected as the reference positions. Alternatively, grooves spaced arbitrary positions from the grooves at the extreme ends may be used as the reference positions. At this time, as already described in connection with FIGS. 1A and 1B, if the array period of the 1D diffraction grating units 5 within the calibration pattern formation region 1 is formed in step with the pitch dimensions of the patterned grooves within the 1D diffraction gratings, the field of view of the SEM can be moved easily across the 1D diffraction gratings, for the following reason. If the field of view is translated by a distance that is an integral multiple of the pitch dimension of the patterned grooves, the field of view can be moved into a position within other arbitrary 1D diffraction grating that corresponds to the position of the 1D diffraction grating currently within the field of view. Accordingly, calculations of amounts of movement made when the stage is moved or the image is shifted or the amount of correction used in providing position control are simplified.

When calculation of information for correction of rotation error ends, measurement of the length of the sample is carried out. FIG. 5 is a flowchart illustrating a sequence of operations of the CD-SEM when metrology data is calibrated. The processing illustrated in the flowchart of FIG. 5 is classified into two major routines: routine (1) for determining the calibration coefficient for metrological data using the standard component and routine (2) for gaining and calibrating the metrological data. When a metrology operation is started, a request for prompting the user to respond as to whether he starts the routine (1) for determining the calibration coefficient is displayed on the display unit 114. In response to a response made from the information input unit 115, the routine (1) is started.

First, the stage is driven to move the standard component 4 for calibration into the position where the component is illuminated with the primary electron beam. A given region, i.e., the range shown in FIG. 1B, is scanned with the beam. This range contains plural 1D diffraction grating units. The magnification is such that the marks 6 can be visually checked. Obtained pixel information is analyzed by the pixel computing unit and the mark corresponding to the 1D diffraction grating unit existing on the optical axis of the primary beam is identified. In this example, information about the coordinates of the arrayed 1D diffraction grating units is stored in an array position unit. Specifically, information about coordinates within a coordinate system appropriately set on the standard component is stored in a corresponding manner to the marks. When the stage is controlled, an appropriate origin alignment is made between the coordinate system of the standard component and the coordinate system used in controlling the stage. Information about coordinates in the coordinate system for the standard component is converted into information about coordinates in the coordinate system used in controlling the stage. The origin alignment for coordinate conversion is made at an appropriate frequency, e.g., whenever the stage carrying the standard component thereon is conveyed into or out of the vacuum housing. Information about the frequencies at which the 1D diffraction grating units corresponding to the marks, respectively, are used and threshold value for the number of uses are stored in a calibration record unit. Additionally, information indicating as to whether 1D diffraction grating units corresponding to the marks contain defects is stored in a grating defect position memory unit.

The identified mark is compared against information stored in the storage portions of the array position unit, calibration record unit, and defect position memory unit. Various items are checked to know whether there is any defect and whether a prescribed number of uses is exceeded. The checked items (e.g., information about the threshold value for the number of uses and unused units of pattern) are set on the recipe screen. If the unit of pattern corresponding to the identified mark satisfies the checked items, the routine for obtaining the calibration coefficient is performed using the present unit of pattern. If the checked items are not satisfied, another appropriate unit of pattern is selected.

As an example, it is assumed that the mark of the unit of pattern moved onto the optical axis of the primary beam by the first movement of the stage is identified as 102-051. The results of a check performed by the pixel computing unit have revealed that the unit of pattern corresponding to the mark 102-051 has no defect but underwent 10 measurements of the pitch using beam irradiation. Accordingly, the pixel computing unit refers to information stored in the storage portions of the array position unit, calibration record unit, and defect position storage portion and computationally finds the mark for the unit of pattern which satisfies the checked items and is closest to the mark 102-051 out of the units of pattern. Furthermore, the pixel computing unit calculates the amount of movement of the stage or the amount of deflection of the beam to move the beam irradiation position to the calculated unit of pattern, and informs the SEM control unit 116 of the calculated amount. The SEM control unit controls the stage driver or scanning deflector 104 based on the incoming information to move the 1D diffraction grating unit to be used into the scanning range of the primary electron beam.

When the movement of the unit of pattern to be used is completed, the magnification is switched to a higher value of magnification at which the 1D diffraction grating unit shown in FIG. 2 almost fully covers the field of view. The unit of pattern is actually scanned with the beam. During the beam scanning, the focus of the secondary electron microscope 117 is adjusted. The adjustment of the focus is made by adjusting electron optical lenses 103 and 105 equipped in the secondary electron microscope 117. In the present embodiment, focusing is done using the convex marks 10 to reduce unwanted beam irradiation of the diffraction grating units to a minimum. Of course, it is also possible to achieve the focusing by irradiating the diffraction grating units of the sample with the primary electron beam.

After the end of the adjustment of the focus, a given region is scanned with the beam. The waveform of the obtained secondary electron signal is signal-processed to find the pitch dimension of the diffraction grating unit by the line-width computing unit. The absolute pitch dimension found by an optical diffraction method is stored in the calibration record unit. The line-width calibration computing unit compares the pitch dimension calculated by the line-width computing unit with the absolute pitch dimension stored in the calibration coefficient memory unit and calculates a calibration coefficient. The found calibration coefficient is stored in the calibration coefficient memory unit. Furthermore, the mark for the diffraction grating unit used for calibration and the number of uses of this 1D diffraction grating unit are stored in the calibration record unit. The fact that a calibration coefficient has been normally derived is displayed on the display unit. If foreign matter or defect is found within the region scanned with the beam, the mark corresponding to the 1D diffraction grating unit is stored in a defect position memory unit. Control then returns to the first position of the routine. An operation for selecting an appropriate unit of pattern is performed.

Figure 5:
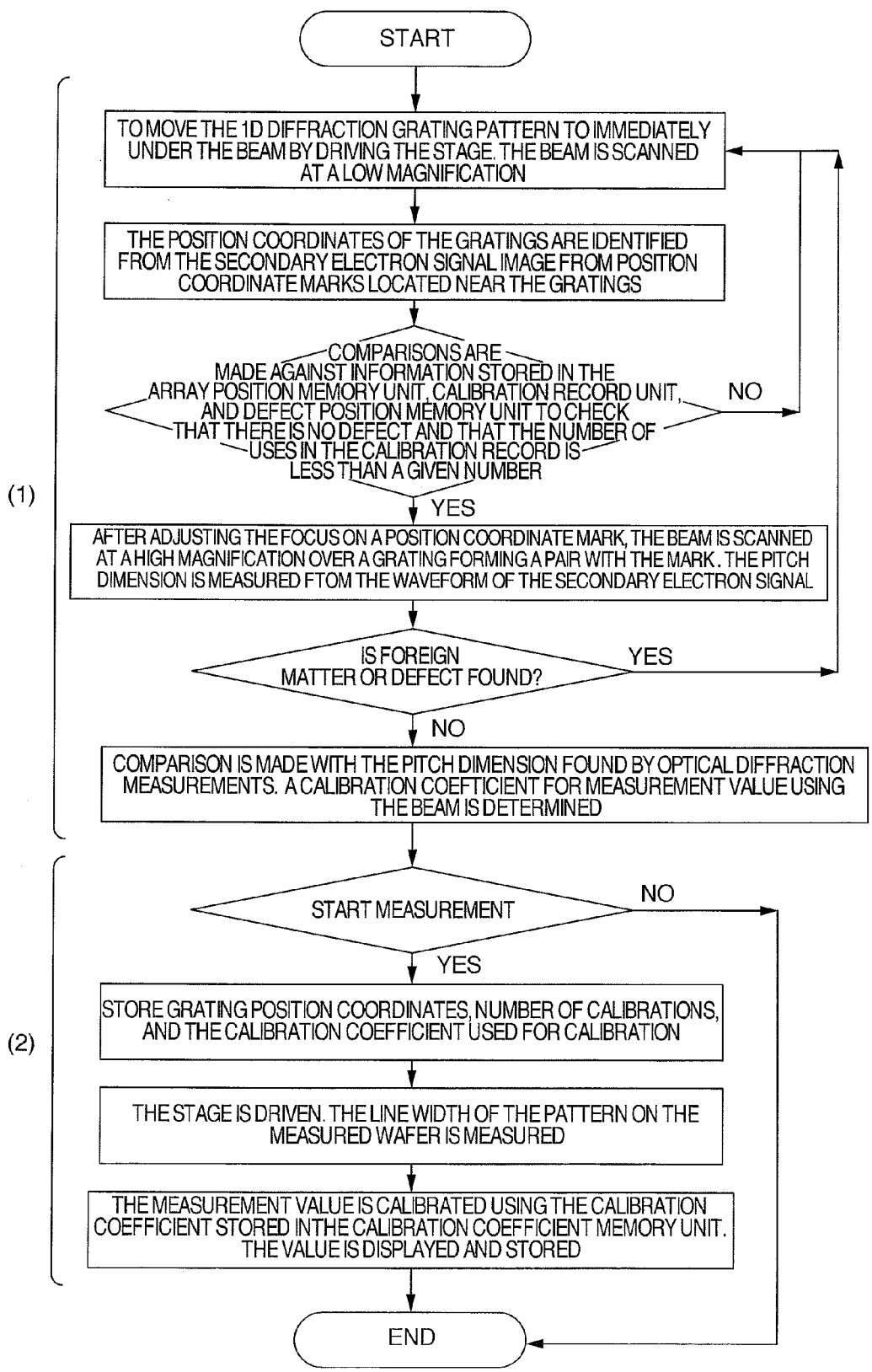
FIG. 5 is a flowchart illustrating a method of calibration according to one embodiment of the present invention.

The routine (2) of FIG. 5 is next described. If the routine (1) is terminated normally, a message is displayed on the display unit 114 to prompt the user to determine whether or not the metrology procedure is subsequently carried out. If a response indicating that the procedure is "carried out" is entered from the information input unit 115, the information process unit 110 moves the stage 109 to bring a desired pattern on the wafer 107 into the electron beam irradiation position. The produced secondary electrons 106 are detected by the secondary electron detector 140 and are entered as a secondary electron signal into the information process unit 110. The pixel computing unit extracts information about the positions of the edge points of the metrology pattern from the entered secondary electron signal and sends the information to the line-width computing unit. This computing unit calculates the line width of the pattern from the obtained information about the positions of the edge points and informs the line-width calibration computing unit of the calculated line width. The line-width calibration computing unit corrects the metrological value using the calibration coefficient obtained in the routine (1). Furthermore, the corrected metrological value is output to the display unit 114, where the value is displayed. As a result of a correction of the metrological value using the calibration component of the present embodiment, a dimensional metrology accuracy of better than 1 nm has been achieved.

In the description of the routines (1) and (2) made so far in connection with the flowchart of FIG. 5, the apparatus automatically executes the routines in response to a request from the user of the apparatus. It is also possible to execute the process steps included in the routines by manual operations of the user of the apparatus. Even in this case, the positions of 1D diffraction grating units can be identified more easily than in the prior art because the mark 6 is given to each unit of pattern. Accurate calibration is accomplished without regardless of the accuracy of the control of the stage position. Furthermore, in the above description, the adjustment of the focus of the primary electron beam is made on the mark to reduce the probability of contamination of 1D diffraction grating units. Conversely, the recipe may be so set that the grating unit corresponding to the same mark is always used. Timewise variations of the contamination can be monitored by monitoring the variations of the actually measured pitch dimension, using the 1D diffraction grating unit in the same position. In this case, a functional block (such as a metrology value memory unit) for storing a pair of data items consisting of the actually measured value of the pattern line width and the number of uses of a certain 1D diffraction grating unit is formed in the memory shown in FIG. 4. In addition, cross-calibration among plural apparatus can be performed based on the same standard by performing calibration using the 1D diffraction grating unit with the same mark for plural metrology SEMs. Consequently, the difference in metrological performance between plural apparatus or machines can be grasped more precisely than heretofore.

As described so far, metrology system, metrology method, and standard component for calibration which facilitate selecting and checking units of pattern and permit stable calibration at all times without being affected by dimensional variations due to contamination or grating defects are accomplished by using the standard component for calibration and metrology SEM of the present embodiment. In the description of the present embodiment, the standard component is applied to the metrology SEM. Obviously, the standard component can also be applied to every kind of applied instrument of scanning electron microscope such as general-purpose SEM and inspection SEM.

Embodiment 2

In the present embodiment, an example of modification of the standard component for calibration described in Embodiment 1 is described. An example of configuration different from the standard component shown in FIGS. 1A and 1B is shown in FIGS. 6A and 6B. Shown in FIG. 6A is a standard component having a region 1 in which a pattern for calibration is formed. A rectangular pattern 11 of dot-shaped elements is formed around the calibration pattern formation region 1 to correct the proximity effect. To pattern an array of one-dimensional diffraction grating units, optical exposure or electron-beam lithography is used. In any exposure method, the proximity effect produces the phenomenon that high-density portions of the pattern are different in microscopic pattern geometry from low-density portions. Additionally, there is a requirement that the cross marks formed around the calibration pattern formation region 1 or the convex marks formed beside the diffraction grating units be placed closer to the calibration pattern formation region 1, for the following reason. If the formation region is spaced remotely from the cross marks and from the array of the 1D diffraction grating units, the amount of movement to the diffraction grating units is increased. This deteriorates the accuracy at which positioning is done relative to a desired diffraction grating unit.

In the standard component shown in FIGS. 1A and 1B, the surroundings of the calibration pattern formation region 1 are blank and any pattern is not formed. Therefore, the units of pattern formed at the extreme ends of the calibration pattern formation region 1 are different in shape from the central portion or slightly deformed grating units of pattern of diffraction gratings are formed. Since the deformation continuously varies from the extreme ends to the central portion, there is the problem that the pitch dimensions of the diffraction gratings have a distribution. As a result, diffraction grating units that can be used for calibration are limited or the calibration accuracy deteriorates. To avoid this adverse effect, a correction is necessary. For example, the amount of exposure is varied between diffraction grating units of pattern at the extreme ends and the diffraction grating units of pattern in the central portion. In practice, it is difficult to make such an adjustment. For example, if the amount of exposure is increased in peripheral portions of the inside of the calibration pattern formation region 1, the effective amount of exposure in the inner portions of the pattern becomes excessive due to the proximity effect. Eventually, it is difficult to suppress the dimensional variations to within 2% using adjustment of the amount of exposure. Furthermore, if cross marks are arranged near the diffraction grating units of pattern at the extreme ends, correction of the amount of exposure becomes complicated. It is difficult to realize a uniform array of 1D diffraction grating units of the pattern.

Accordingly, in the standard component shown in FIG. 6A, rectangular patterns 11 each 2.5 μm square are added around the calibration pattern formation region 1 at pitches of 5 μm in the vertical and horizontal directions and exposure is made to correct the proximity effect. The exposure regions of the added rectangular patterns are 4 columns at minimum and 12 columns at maximum. At a field magnification as shown in FIG. 6A, only dots are visible. However, enlarging the field shows that rectangular recesses each 2.5 μm square are formed.

Figure 7A:
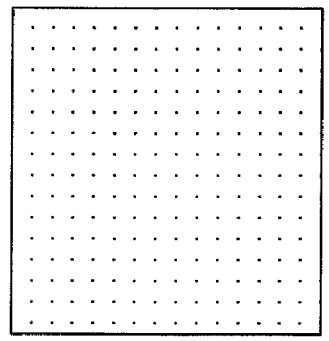
FIGS. 7A and 7B are plan views of stencil marks for an electron-beam block exposure system.
Figure 7B:
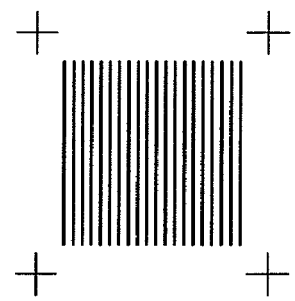

A method of fabricating the standard component shown in FIGS. 6A and 6B is next described. First, resist is applied to the surface of a silicon substrate. Then, a pattern opening 17 for calibration is selected and an exposure is made, using an electron beam block exposure system on which a stencil mask having openings 16 and 17 shown in FIGS. 7A and 7B is placed. Then, as shown in FIGS. 1A, 1B, and 2, each individual unit of pattern corresponding to a numeral in a mark is exposed, using the rectangular opening 16 at a side of the position where the pattern of diffraction grating units has been exposed. Also, convex marks are exposed on the left side of the units of pattern using a variable-shaped electron beam. Similarly, cross marks for correction of rotation error are exposed on both sides of the calibration pattern formation region 1 using a variable-shaped electron beam. After development, using the resist as a mask, the silicon substrate is etched. Thus, a standard component chip 4 having one-dimensional diffraction grating units is obtained.

The difference between a standard component on which a pattern for correcting the proximity pattern is formed and a standard component on which such a pattern is not formed is described while taking the standard component of FIGS. 1A and 1B as a comparative example.

Figure 8A:
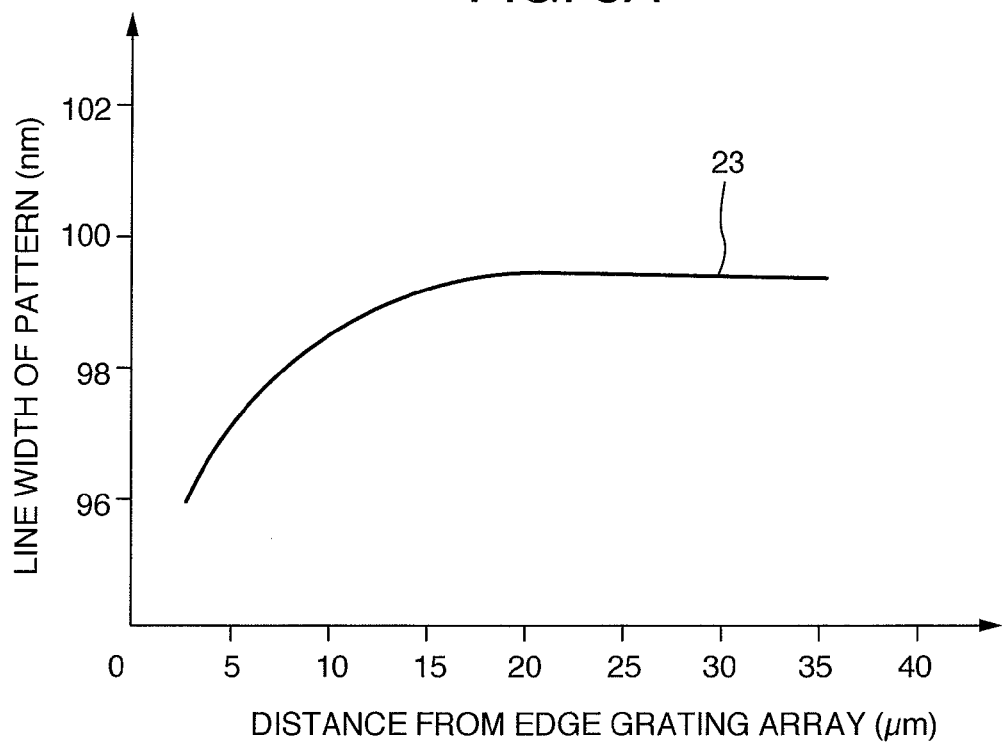
FIGS. 8A and 8B are graphs showing the effect of patterns for correction of the proximity effect.
Figure 8B:
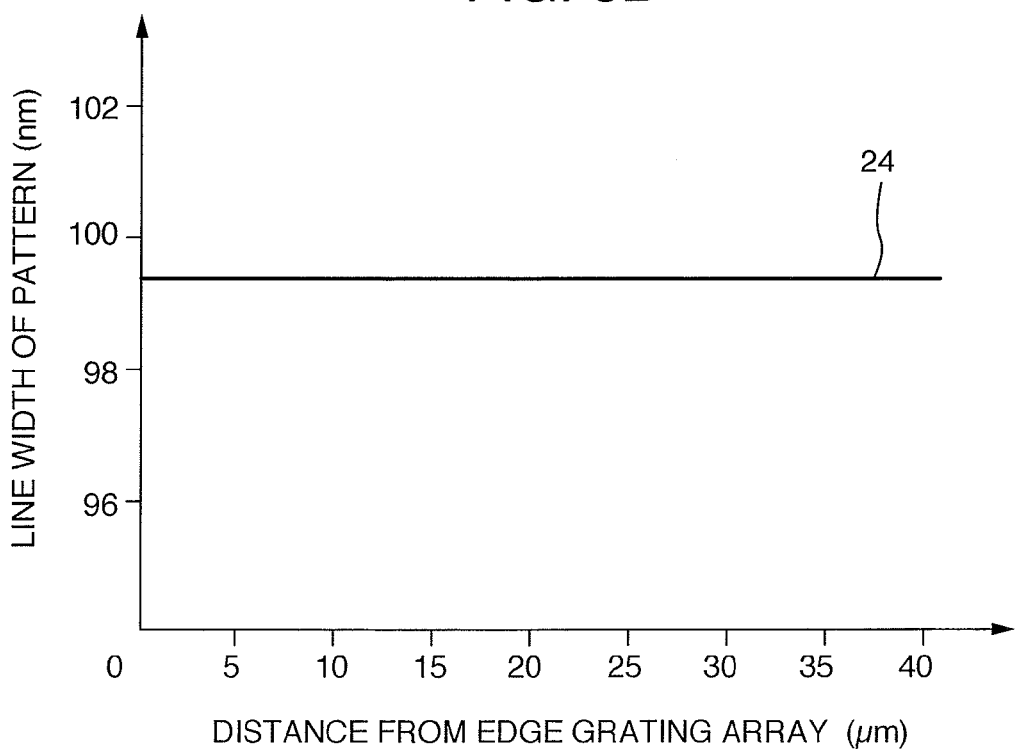

FIG. 8A shows the results of a measurement of the absolute pitch dimension of the standard component shown in FIG. 1A. The measurement was made along line segment A-A' shown in the region 1 for formation of a pattern for calibration, using the metrology SEM. Similarly, FIG. 8B shows the results of a measurement of the pitch dimension of one-dimensional diffraction gratings using a metrology SEM and an optical measurement method. In each of FIGS. 8A and 8B, the horizontal axis indicates the distance from one end of the calibration pattern formation region 1 or 12. The vertical axis indicates the measured pitch dimension.

In FIG. 8A, the absolute pitch dimension on the line segment A-A' varies in going from the extreme ends of the calibration pattern formation region 1 toward the center. In FIG. 8B, the absolute pitch dimension on the line segment B-B' is not observed to be varied. Precise analysis reveals that the rate of variation of the absolute dimension on the line segment B-B' is suppressed to less than 1%. Furthermore, when the cross pattern 3 was formed, the uniformity did not vary. Consequently, it can be seen that the pitch dimension was less than 1% of the absolute dimension, i.e., less than 1 nm, even if any diffraction grating unit is used.

The pattern shaped to correct the proximity effect is not limited to the rectangular pattern shown in FIG. 6A. Other patterns can also be used unless any periodic array corresponding to an integral multiple of the pitch dimension of the one-dimensional diffraction grating units is contained. That is, in an optical measurement, the diffraction gratings are illuminated with laser light, and the pitch dimension is found from the angle of the diffraction light. If the pattern shaped to correct the proximity effect contains a periodic array corresponding to an integral multiple of the pitch dimension of the 1D diffraction grating units, the pattern shaped to correct the proximity effect is also illuminated with the laser light. Consequently, if the pattern shaped to correct the proximity effect contains a periodic array corresponding to the integral multiple of the pitch dimension of the diffraction grating units, diffraction light from the periodic array is produced near the diffraction light arising from the diffraction gratings. This produces error in measuring the angle of the diffraction light when the pitch dimension is measured.

Figure 9:
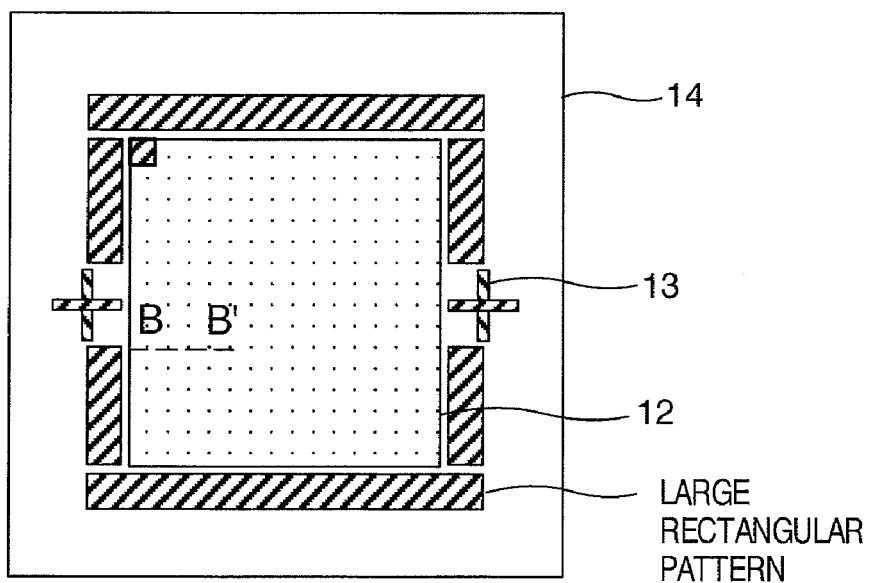
FIG. 9 is a plan view of a modification of the standard component for calibration, the standard component being built according to Embodiment 2 of the present invention.

FIG. 9 shows an example of modification to the proximity effect correction pattern shown in FIG. 6A. That is, a pattern different from the pattern shown in FIG. 6A is formed. In the case of FIG. 9, a rectangular pattern larger than the pattern of FIG. 6A is formed around the calibration pattern formation region 1. The large rectangular pattern shown in FIG. 9 has a vertical dimension of 10 μm and a lateral dimension of about 2 mm.

The advantages of the standard component of Embodiment 1 can be produced by forming a pattern formation surface for the standard component for calibration in addition to the pattern for correction of the proximity effect as described so far. Additionally, the outermost portions of the inside of the calibration pattern formation region 1 and the central portion can be patterned under the same exposure conditions. Consequently, the dimensional accuracy can be made uniform. Moreover, the effects of the proximity effect on the positions where the convex marks are arranged can be eliminated, the convex marks corresponding to the one-dimensional diffraction grating units in the outermost portions. In consequence, the convex marks can be arranged adjacent to the 1D diffraction grating pattern units in the outermost portions. Accordingly, the accuracy at which movement to a desired diffraction grating unit is made can also be enhanced. Further, where the standard component of the present embodiment is used in the metrology SEM described in Embodiment 1, it is obvious that more accurate calibration results can be obtained than where the standard component of Embodiment 1 is used.

Embodiment 3

In the description of Embodiments 1 and 2, patterned grooves of one-dimensional diffraction grating units on the standard component chip are oriented in the same direction. However, a metrology SEM does not always measure only line patterns oriented in the same direction at all times within the field of view of the SEM. There is the possibility that the metrology SEM measures both a sample in which the longitudinal direction of lines is in the X-direction and another sample in which the longitudinal direction is in the Y-direction. Accordingly, in the present embodiment, a standard sample for calibration is described, the sample having one-dimensional diffraction grating units provided with patterned grooves formed in both X- and Y-directions. In the description of the present embodiment that follows, it is assumed that the metrology equipment shown in FIG. 3A is used as a microscope.

Figure 10:
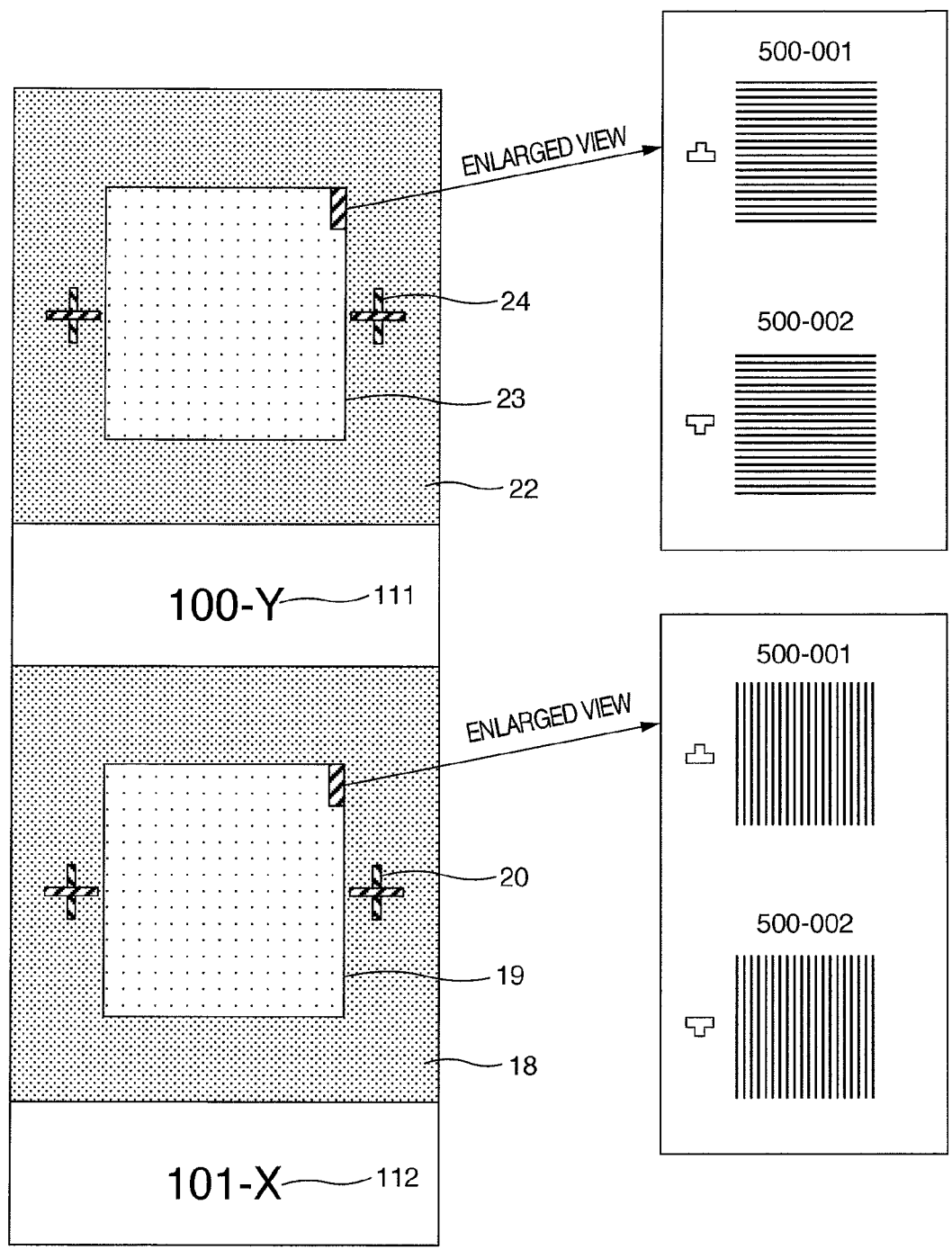
FIG. 10 is a fragmentary enlarged view of a standard component in the form of a wafer.

FIG. 10 shows a standard component for calibration, the calibration having two pattern formation regions 19 and 23 for calibration. The regions have patterned grooves of one-dimensional diffraction grating units in mutually perpendicular directions. Patterns 18 and 22 for correction of the proximity effect similar to the pattern shown in FIG. 6A are formed around the calibration pattern formation regions 19 and 23. The two regions 19 and 23 are formed on the same silicon chip 21. The pitch dimensions in the vertical and lateral directions of the 1D diffraction grating units have been accurately found by measurement of diffraction angle. Therefore, if the standard component shown in FIG. 10 is used, metrology calibration of metrology data in the vertical and lateral directions (X- and Y-directions) can be carried out with the same standard component. In the past, when standard components for calibration for X- and Y-directions were fabricated, the standard components for the X- and Y-directions, respectively, were stuck to a fixing substrate. In this method, when the components were stuck, the surfaces of the standard components for the X- and Y-directions, respectively, were subtly different in height. Therefore, when the electron beam is calibrated, the focal position becomes different depending on whether the standard component for the X-direction is used or the standard component for the Y-direction is used. Consequently, SEM images cannot be obtained under the same electron optical conditions. This has made it impossible to perform calibration procedures in the X-direction and Y-direction at the same time within the same field of view.

On the vertical pattern, character set 1102 of 100-X indicating the chip number and direction is written near the diffraction grating array as a symbol set indicating the direction of diffraction gratings. On the lateral pattern, character set 1101 of 101-Y indicating the chip number and direction is written. The size of each one character is 1 mm. Therefore, in low-magnification observations where diffraction grating patterns cannot be discerned or in optical microscopy, the patterns can be easily discerned. Furthermore, when a silicon chip 21 is stuck to a standard component holder, orientational alignment can be performed easily.

Figure 11:
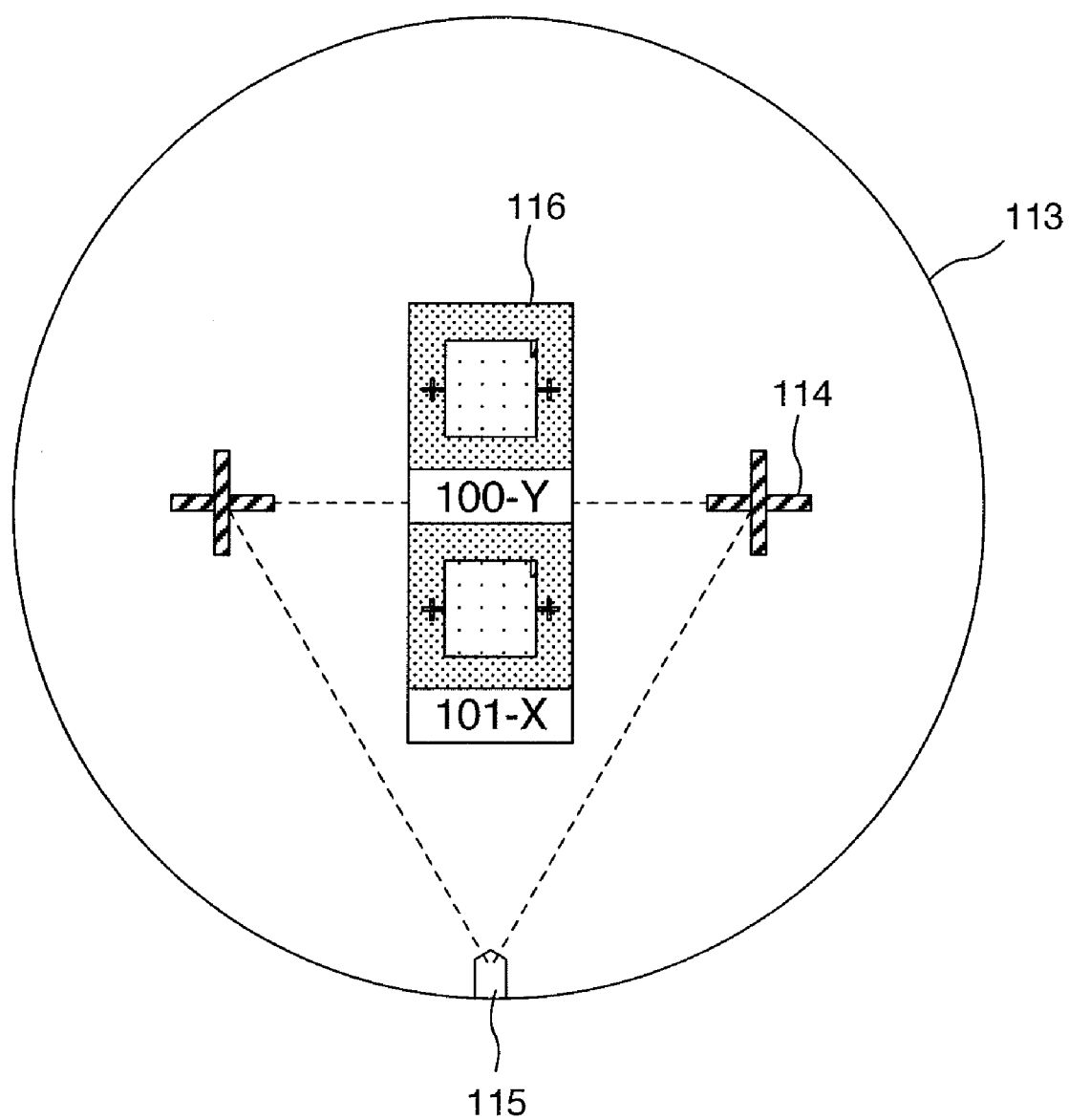
FIG. 11 is a top view of the whole of a standard component in the form of a wafer.
Figure 12B:
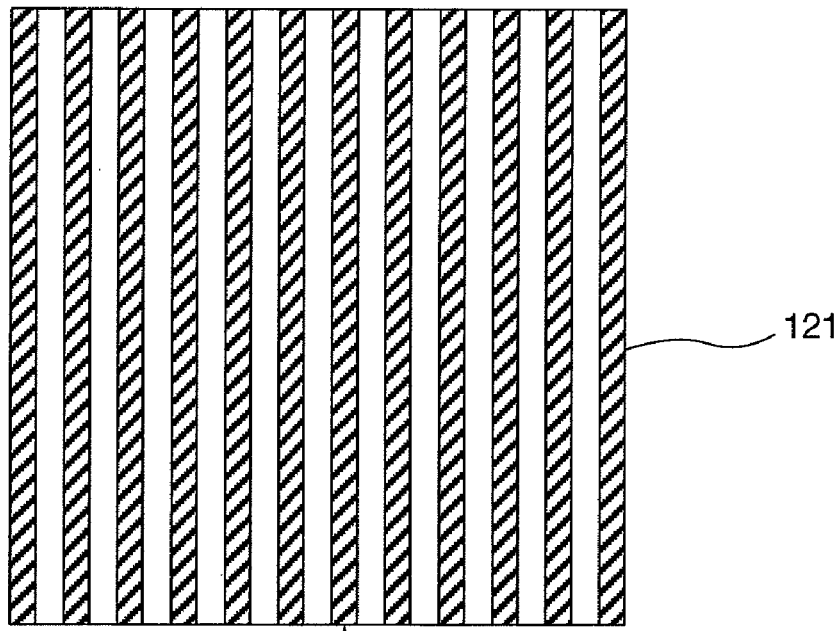
FIGS. 12A and 12B show prior-art patterns for calibration.
Figure 12A:
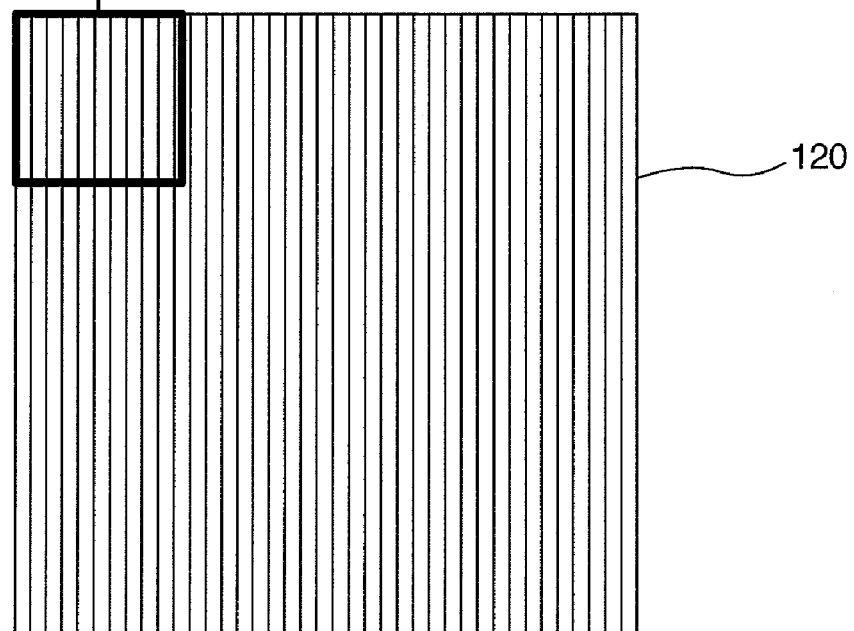

An example of a standard component in the form of a wafer is next described. One example of standard component in the form of a wafer is shown in FIG. 11. A diffraction grating array 106 is formed in the center of the wafer 103. In the same way as the standard components described in Embodiments 1 and 2, the absolute value of the pitch dimension of patterned grooves formed in the diffraction grating array 106 has been found at an accuracy better than 1 nm by diffraction angle measurement using laser light. Cross marks 104 formed on both sides of the diffraction grating array 106 are formed in positions symmetrical with respect to a notch 105.

In the embodiment described below, metrology calibration is applied to the wafer-shaped standard component shown in FIG. 11, using the CD-SEM already described in connection with FIG. 3A. The wafer-shaped standard component shown in FIG. 11 is conveyed into the CD-SEM shown in FIG. 3A via a load lock chamber. That is, instead of a sample to be measured metrologically, the standard component in the form of a wafer is placed on a stage 109.

First, the stage is driven to move the diffraction grating array 106 into an area illuminated with a primary electron beam. When the wafer-shaped component is installed on the instrument, the component is placed on the stage 109 using a notch 105 as an alignment reference. Then, cross marks 104 for correction of rotation error are formed in positions that are symmetrical with respect to the notch 105. Furthermore, the standard component is prepared such that the diffraction grating array 106 is located in the midpoint between the two cross marks 104. In the standard component shown in FIG. 11, the two cross marks 104 are so formed as to be located in the positions of the basic angles of an isosceles triangle whose vertical angle is formed by the notch. When the wafer-shaped component is conveyed into the vacuum chamber of a scanning electron microscope 117, rough alignment is performed in the direction of rotation of the wafer-shaped component, using the notch as a reference. The rough alignment is an operation for adjusting the position of the wafer-shaped component in the direction of rotation such that the position of the notch is within a given error relative to a reference position in the direction of rotation of the stage. The roughly aligned wafer-shaped component is conveyed into the vacuum housing via the load lock chamber. The cross marks 104 are automatically detected. During the automatic detection of the cross marks 104, the magnification of the electron optical system within the scanning electron microscope 117 is so adjusted that at least one of the cross marks 104 is within the field of view. Then, the stage is translated within the XY-plane to move the cross mark 104 to the position hit by the primary electron beam. Information about the positions of the cross marks 1104 and the notch 105 or information about the distance between each cross mark 104 and the notch 105 is stored in the memory 112 shown in FIG. 4. The CPU 111 calculates the amount of movement of the stage from the positional information or information about the distance and transmits the calculated amount to the stage control unit within the SEM control unit 116. In consequence, automatic movement of the cross marks 104 is accomplished.

In the prior-art standard components, there are no cross marks or, if any, the positions of the cross marks on a wafer have not been determined based on the notch. Accordingly, after the wafer is conveyed in, the positioning accuracy is about ±10 μm when movement to the diffraction grating array 106 is made. On the other hand, in the standard component of the present embodiment having the cross marks formed based on the notch, error in movement of the beam irradiation position to the cross marks 104 and diffraction grating array 106 is ±2 μm, which is a great improvement over the prior-art standard components. In consequence, the component can be moved into a desired position in one detection operation. As a result, when the beam irradiation position is moving, the frequency at which automatic detection produces error is reduced greatly. Hence, the frequency at which realignment is performed is reduced. The time taken to perform the calibration including the time from conveyance of the wafer 103 into the instrument to acquisition of an SEM image for calibration is shortened greatly.

In the same way as in the standard components of Embodiments 1 and 2, the standard component of the present embodiment is effectively applied to calibration of plural SEMs or to measurement of differences between instruments. Where plural SEMs are calibrated using a wafer-shaped standard component, arrangement of marks based on a notch produces especially effective results, for the following reason. Because the standard component is repeatedly conveyed into and out of the vacuum housing, decrease of the frequency of realignment operations produces accordingly greater effects.

Embodiment 3 has been described so far. Obviously, the standard component of the present embodiment can be applied to every kind of applied instrument of scanning electron microscope such as general-purpose SEM and inspection SEM, other than metrology SEM.

In Embodiments 1-3 described so far, examples of configuration using numerals as marks indicating coordinate positions have been described. Similar advantages can be obtained even using combinations of plural symbols other than numerals. If many repeating elements close in size to the pitch dimension of diffraction gratings are used, the accuracy obtained when the diffraction angle is measured is affected. Consequently, numerals are effectively used as marks because they can be discriminated from other symbols easily.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A standard component for calibration, comprising:
    plural one-dimensional diffraction grating units formed on a substrate;
    said plural one-dimensional diffraction grating units arranged in two dimensions on a surface of said standard component;
    a mark associated with each one-dimensional diffraction grating unit and arranged in two dimensions and formed beside its associated one-dimensional diffraction grating unit; and
    plural grooves formed in the diffraction grating units and spaced from each other by a pitch spacing, the grooves having a previously found pitch dimension;
    wherein the marks are larger than the pitch dimension,
    wherein each mark is different from each other, and each mark uniquely identifies its associated diffraction grating unit within a two-dimensional arrangement,
    wherein said one-dimensional diffraction grating units are arranged periodically at given intervals vertically and laterally, and
    wherein said marks contain numerals indicating locations of said marks.

2. A standard component for calibration as set forth in claim 1, wherein said one-dimensional diffraction grating units are periodically arranged on said substrate, and wherein the array pitch of the diffraction grating units arranged in a direction parallel to the patterned grooves in the one-dimensional diffraction grating units is an integral multiple of the pitch dimension of the one-dimensional diffraction gratings.

3. A standard component for calibration as set forth in claim 1, wherein the pitch dimension of said one-dimensional diffraction grating units is less than 100 nm.

4. A standard component for calibration as set forth in claim 1, wherein said one-dimensional diffraction grating units are arranged periodically at given intervals vertically and laterally, and wherein said marks contain numerals or symbols indicating coordinates in the arrangement in a vertical or lateral direction.

5. A standard component for calibration as set forth in claim 1, wherein patterns for correction of a proximity effect are formed further around the whole region in which said plural one-dimensional diffraction grating units are formed on a surface of said standard component for calibration on which a pattern is formed.

6. A standard component for calibration as set forth in claim 5, wherein said patterns for correction of a proximity effect are rectangular patterns that are smaller than said pitch dimension.

7. A standard component for calibration as set forth in claim 5, wherein said plural one-dimensional diffraction grating units and their corresponding marks are formed on a semiconductor wafer, and wherein the semiconductor wafer has a notch or an orientation flat and cross marks formed symmetrically with respect to the notch or orientation flat.

8. A standard component for calibration as set forth in claim 1, wherein there is further provided at least one pair of cross marks formed around said one-dimensional diffraction grating units.

9. A standard component for calibration as set forth in claim 1, wherein
    (A) a first region and a second region are formed on said substrate,
    (B) in the first region, plural one-dimensional diffraction grating units formed by a pattern of grooves perpendicular to an X-direction are arranged in two dimensions, and
    (C) in the second region, plural one-dimensional diffraction grating units formed by a pattern of grooves perpendicular to a Y-direction are arranged in two dimensions.

10. A standard component for calibration as set forth in claim 9, wherein a first mark corresponding to said first region and a second mark corresponding to said second region are formed.

11. A metrology method of calculating a calibration coefficient for metrology data, using the standard component for calibration, the standard component being set forth in claim 1.

12. A standard component for calibration as set forth in claim 1, wherein each mark contains information that identifies X-Y coordinate positions of its associated one-dimensional diffraction grating unit.

13. A standard component for calibration as set forth in claim 1, wherein a width of said groove between each mark is larger than a width of said each mark.

14. A standard component for calibration, comprising:
plural diffraction grating units formed on a semiconductor substrate;
said plural diffraction grating units arranged in two dimensions on a surface of said standard component;
a mark associated with each diffraction grating unit and arranged in two dimensions and formed beside its associated one-dimensional diffraction grating unit; and
plural grooves formed in the diffraction grating units and spaced from each other by a pitch spacing, the grooves having a pitch dimension found by optical means;
wherein the marks are larger than the pitch dimension,
wherein each mark is different from each other, and each mark uniquely identifies its associated diffraction grating unit within a two-dimensional arrangement,
wherein said one-dimensional diffraction grating units are arranged periodically at given intervals vertically and laterally, and
wherein said marks contain numerals indicating locations of said marks.

15. A metrology method of calculating a calibration coefficient for metrology data, using the standard component for calibration, the standard component being set forth in claim 14.

16. A standard component for calibration as set forth in claim 14, wherein each mark contains information that identifies X-Y coordinate positions of its associated one-dimensional diffraction grating unit.

17. A standard component for calibration as set forth in claim 14, wherein a width of said groove between each mark is larger than a width of said each mark.

18. A metrology system having a secondary electron microscope for illuminating a sample with a primary electron beam and detecting a resulting secondary electron signal, an SEM control unit for controlling components of the secondary electron microscope, and an information process unit for processing the secondary electron signal and measuring a line width of a line pattern formed on the sample, said metrology system comprising:
a standard component for calibration, said standard component including:
plural one-dimensional diffraction grating units formed on a substrate,
said plural one-dimensional diffraction grating units arranged in two dimensions on a surface of said standard component,
a mark associated with each one-dimensional diffraction grating unit and arranged in two dimensions and formed beside its associated one-dimensional diffraction grating unit,
plural grooves formed in the diffraction grating units and spaced from each other by a pitch spacing, the grooves having a previously found pitch dimension; and
a calibration record unit for storing information about the number of uses of the plural one-dimensional diffraction grating units by using the marks associated with the one-dimensional diffraction grating units, based on information about the secondary electron signal obtained by illuminating a standard component for calibration with the primary electron beam, the standard component having a surface on which said one-dimensional diffraction grating units and said marks are formed,
wherein the marks are larger than the pitch dimension,
wherein each mark is different from each other, and each mark uniquely identifies its associated diffraction grating unit within a two-dimensional arrangement,
wherein said one-dimensional diffraction grating units are arranged periodically at given intervals vertically and laterally, and
wherein said marks contain numerals indicating locations of said marks.

19. A metrology system as set forth in claim 18, wherein information about a threshold value of the number of uses of said one-dimensional diffraction grating units is stored in said calibration record unit, and wherein said information process unit searches for one-dimensional diffraction grating units illuminated with the electron beam when a calibration coefficient about metrology data is calculated, except for one-dimensional diffraction grating units for which the number of uses has reached the upper limit.

20. A metrology system as set forth in claim 18, further including a defect position memory unit for storing marks for one-dimensional diffraction grating units containing foreign matter or defects.

21. A metrology system as set forth in claim 18, wherein when said primary electron beam is brought to a focus, the focus of the secondary electron microscope is adjusted by illuminating the marks with the primary electron beam and using an obtained secondary electron signal.

22. A metrology method of calculating a calibration coefficient for metrology data, using the standard component for calibration, the standard component being set forth in claim 18.

23. A metrology system as set forth in claim 18, wherein a width of said groove between each mark is larger than a width of said each mark.

* * * * *